United States Patent [19]

Brambilla et al.

[11] Patent Number: 5,266,885
[45] Date of Patent: Nov. 30, 1993

[54] GENERATOR OF REFERENCE VOLTAGE THAT VARIES WITH TEMPERATURE HAVING GIVEN THERMAL DRIFT AND LINEAR FUNCTION OF THE SUPPLY VOLTAGE

[75] Inventors: Massimiliano Brambilla, Sesto S. Giovanni; Vanni Poletto, Camino, both of Italy

[73] Assignee: SGS-Thomson Microelectronics s.r.l., Milan, Italy

[21] Appl. No.: 851,980

[22] Filed: Mar. 12, 1992

[30] Foreign Application Priority Data

Mar. 18, 1991 [IT] Italy .................. MI91 A 000720

[51] Int. Cl.[5] .............................................. G05F 3/30
[52] U.S. Cl. .................................... 323/313; 323/907; 323/315
[58] Field of Search ............... 323/907, 313, 315, 316; 307/296.1, 296.6, 296.7

[56] References Cited

U.S. PATENT DOCUMENTS

| | | | |
|---|---|---|---|
| 3,979,663 | 9/1976 | Herchner | 232/4 |
| 4,016,435 | 4/1977 | Voorman | 307/296.1 |
| 4,323,854 | 4/1982 | Hester | 330/256 |
| 4,325,017 | 4/1982 | Schade, Jr. | 323/313 |
| 4,443,753 | 4/1984 | McGlinchey | 323/313 |
| 4,587,478 | 3/1986 | Kasperkovitz et al. | 323/316 |
| 4,967,139 | 10/1990 | Betti et al. | 323/312 |
| 5,001,414 | 3/1991 | Brambilla et al. | 323/313 |
| 5,049,806 | 9/1991 | Urakawa et al. | 323/314 |
| 5,068,595 | 11/1991 | Kearney et al. | 323/316 |
| 5,103,159 | 4/1992 | Breugnot et al. | 323/315 |
| 5,160,882 | 11/1992 | Ten Eyck | 323/314 |

Primary Examiner—Steven L. Stephan
Assistant Examiner—Ben Davidson
Attorney, Agent, or Firm—Seed and Berry

[57] ABSTRACT

The generator of reference voltage comprises a first current generator suitable for generating a current that varies linearly with the supply voltage, a first voltage generator suitable for generating a constant voltage with zero thermal drift, a second current generator suitable for generating a current dependent on the voltage with zero thermal drift, a second voltage generator suitable for generating a voltage with given thermal drift, a third current generator suitable for generating a current dependent on the voltage with given thermal drift and means for combining the three currents together so as to produce across an output resistance an output voltage having a value equal to the product of the output resistance by the first and third current, divided by the second current.

17 Claims, 1 Drawing Sheet

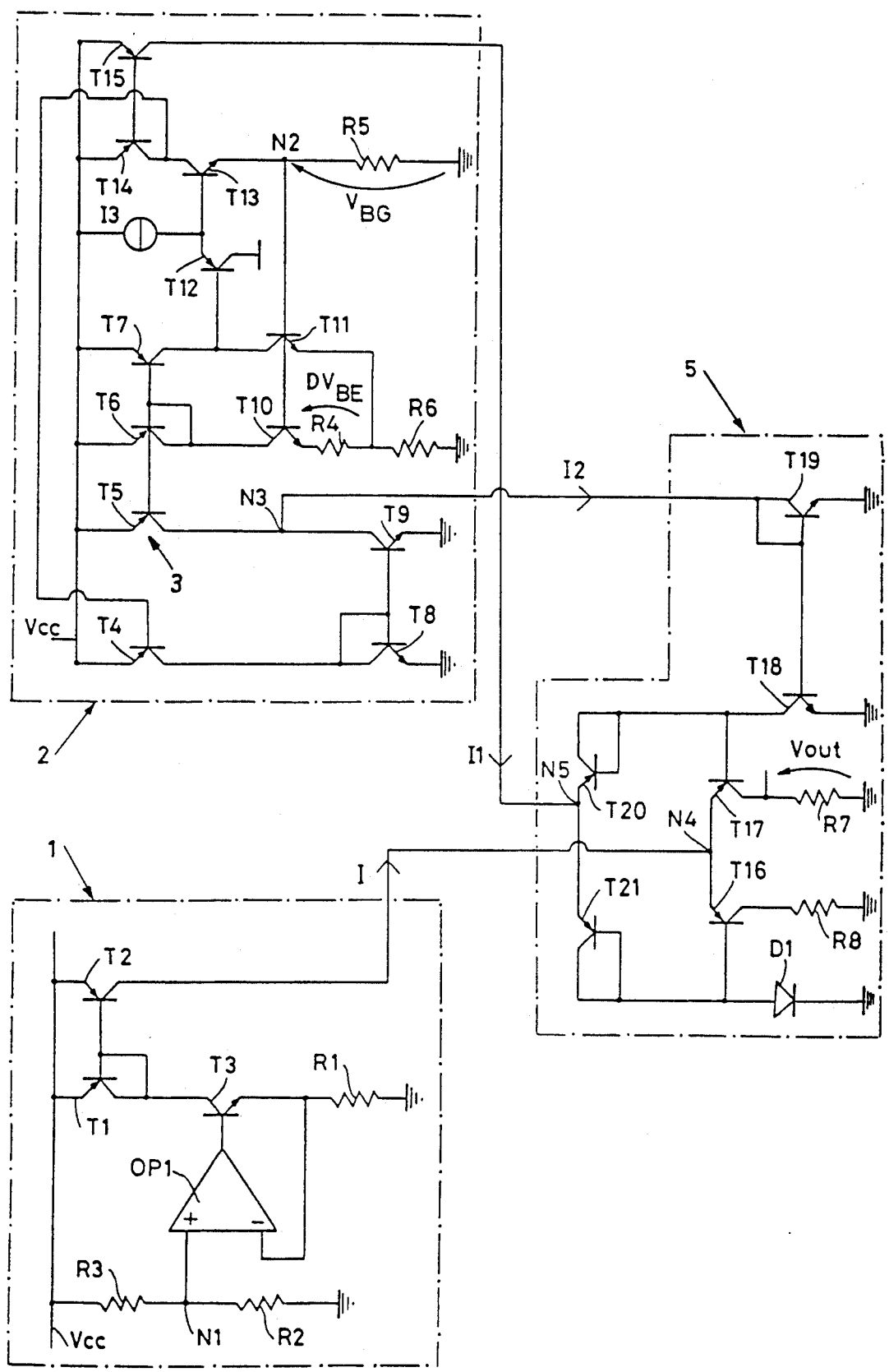

GENERATOR OF REFERENCE VOLTAGE THAT VARIES WITH TEMPERATURE HAVING GIVEN THERMAL DRIFT AND LINEAR FUNCTION OF THE SUPPLY VOLTAGE

TECHNICAL FIELD

The present invention relates to a generator of reference voltage that varies with temperature having given thermal drift and linear function of the supply voltage.

BACKGROUND OF THE INVENTION

The need is known of having available a generator of reference voltage capable of tracking with a high degree of accuracy the voltage drop across a resistance in a temperature interval ranging from −40° C. to +150° C.

As is known, the voltage drop across a resistance is normally used in a control circuit of a load current, wherein there is a comparator which at one input is supplied with a reference voltage and at the other input is supplied with a voltage present across a sensing resistance arranged in series with the load with the interposition of a switch. A control circuit operated by the output of the comparator opens the switch every time the voltage across the sensing resistance is higher than the reference voltage, making it thus possible to control the current flowing through the load.

It is important to have a generator of reference voltage having a heat coefficient that is the same as that of the sensing resistance, so that it is possible to read and control the value of the current in the load with the same degree of accuracy at all temperatures.

This is obtained, for example, with the generator described in the Italian Patent Application No. 22470 A/90 filed on Dec. 21, 1990 and corresponding U.S. patent application Ser. No. 07/811,261, filed on Dec. 19, 1991.

SUMMARY OF THE INVENTION

The object of the present invention is now that of obtaining a generator of reference voltage that, in addition to tracking the voltage drop across a resistance that varies with temperature, varies its absolute value linearly with the supply voltage according to a given law.

According to the invention such object is attained with a generator of reference voltage, characterized in that it comprises a first generator of current suitable for generating a first current that varies linearly with the supply voltage, a first generator of voltage suitable for generating a constant first voltage with zero thermal drift, a second generator of current suitable for generating a second current dependent on said voltage with zero thermal drift, a second generator of voltage suitable for generating a second voltage with given thermal drift, a third generator of current suitable for generating a third current dependent on said voltage with given thermal drift and means for combining said currents together so as to produce across an output resistance an output voltage having a value equal to the product of said output resistance by said first and third current, divided by said second current.

In such a way, by selecting the heat coefficient of the different current generators and of the output resistance in an appropriate manner, it is possible to obtain an output voltage, constituting the desired reference voltage, that varies with temperature with given thermal drift and is linear function of the supply voltage.

BRIEF DESCRIPTION OF THE DRAWINGS

FIG. 1 illustrates one embodiment as an example of the principles of the present invention.

DETAILED DESCRIPTION OF THE INVENTION

This application is based on Italian Patent Application No. MI 91 A 000720, which is hereby incorporated by reference.

With reference to the illustrated FIG. 1, the generator of reference voltage according to the invention comprises a circuit 1 for generating a first current I as a linear function of the supply voltage, a circuit 2 for generating a second current I1 depending on a first voltage with zero thermal drift and a third current I2 dependent on a second voltage with given thermal drift and an output circuit 5 which receives the currents I, I1, I2 as inputs and produces the desired output voltage Vout.

In particular, the circuit 1 comprises a transistor T1 and a transistor T2 of the type pnp connected together in a current mirror configuration. The emitters of the transistors T1 and T2 are connected to a supply voltage Vcc, the collector of the transistor T2 represents the output of the circuit 1, on which there is the first current I, which depends linearly on the supply voltage Vcc, and the bases of the transistors T1, T2 are connected together. The base of the transistor T1 and the collector of the same are connected together and to the collector of a transistor T3 of the type npn. The base of the transistor T3 is connected to the output of an operational amplifier OP1. The emitter of the transistor T3 is connected to ground through a resistance R1 and is connected directly to the inverting input of the operational OP1. The non-inverting input of the operational OP1 is connected to an intermediate node N1 between two resistances R3 and R2 connected in series between the power supply Vcc and ground.

Since the voltage across the inverting input of the operational OP1 equals the tension across the non-inverting input of the same, equal to $(R2/R3+R2)Vcc$, the operational OP1 causes the transistor T3 to deliver a current equal to $(R2/R3+R2)Vcc/R1$, that is a current $I=(k_1 Vcc)/R1$, where $k_1=(R2/R3+R2)$. The current I is mirrored by the transistor T1 on the transistor T2 and is thus present at output from the circuit 1.

The circuit 2 in turn comprises a current mirror 3 formed by transistors T6, T7, T5, of the type pnp. The bases of the transistors are connected together, the emitters are connected together and to the power supply Vcc, the base of the transistor T6 is connected to the collector of the same. The collectors of the transistors T6, T7 are connected to respective collectors of two transistors T10, T11 with different emitter areas (the emitter area of T10 being greater than the emitter area of T11). The variable A is used to represent the ratio of the emitter areas of transistors T10 and T11, respectively. The base of the transistor T10 is connected to the base of the transistor T11. The emitters of the two transistors T10, T11 are connected together through a resistance R4 and to ground through a resistance R6. Taken as a whole the transistors T10, T11 generate across the resistance R4 a voltage $DV_{BE}$ that depends on the emitter areas of the transistors T10 and T11 and has given thermal drift, where $DV_{BE}=V_{BE11}-V_{BE10}$ (base-emitter voltages of the transistors T11 and T10, respectively). The resistance R4 thus has flowing through it a current $DV_{BE}/R4$ which, due to the effect of the current mirror T5, T6, T7, is taken back on the collector of the transistor T5 at input of a circuit node N3.

The circuit 2 also comprises a transistor T12 of the type pnp, whose base is connected to the collector of the transistor T11. The collector of the transistor T12 is grounded and the emitter is supplied with the current generated by a generator of current I3 interposed between the supply voltage Vcc and the base of a transistor T13 of the type npn, which has the emitter connected to ground through a resistance R5 and the collector connected to the collector of a pnp transistor T14, which has the emitter connected to the common emitters of the transistors T5, T6 and T7 and of a further pnp transistor T15, which has the base connected to that of the transistor T14. Across the resistance R5, between an intermediate node N2 connected to the base of the transistors T10, T11 and ground, there is a bandgap voltage $V_{BG}$, which is produced in a known manner by the transistors T10 and T11 together with the resistances R4 and R6 and has zero thermal drift. The resistance R5 thus has a current $V_{BG}/R5$ flowing through it, which through the transistors T14 and T15 is mirrored on the latter's collector as current I1 dependent on a voltage $V_{BG}$ with a zero thermal drift. A further current mirror is formed by the same transistors T14 and T15, by a further pnp transistor T4 with the base connected to the common collector of the transistors T13 and T14 and emitter connected to those of the transistors T5, T6, T7, T14 and T15, and by two npn transistors T8 and T9 with common base, that have the emitters connected to ground and the collectors connected to the collector of the transistor T4 (as well as to the base of the same transistor T8) and to the circuit node N3, respectively. Due to the current mirror arrangement, the current $V_{BG}/R5$ is also taken back on the node N3.

In this way, as can be seen by applying Kirchhoff's law of currents, a current I2 flows out of the node N3 that is equal to $(DV_{BE}/R4-V_{BG}/R5)$ which depends linearly on temperature.

In fact, the difference between the base-emitter voltages of the transistors T10, T11 is equal to:

$$DV_{BE} = nV_T \ln (I_{S10}/I_{C10})(I_{C11}/I_{S11}) \qquad (a)$$

where $V_T$ is the voltage equivalent of the temperature, defined by the relation $V_T = kT/q$ (k = Boltzmann's constant, T = absolute temperature, q = electron charge), $I_{C10}$, $I_{C11}$ are the collector currents of the transistors T10, T11 and $I_{S10}$, $I_{S11}$ are the saturation currents of the transistors T10, T11.

If $$I_{C10} = I_{C11}$$

$$I_{S10} = AI_{S11}$$

with A the ratio between the emitter areas of the two transistors T10, T11 we get:

$$DV_{BE} = nV_T \ln A = nkT/q \ln A \qquad (b)$$

(k = Boltzmann's constant, T = absolute temperature, n = technological parameter independent of temperature).

Equation (b) can also be written:

$$DV_{BE} = n(kT_o/q) \ln A + n(k(T-T_o)/q) \ln A \qquad (c)$$

with To = reference temperature.

Carrying on, from equation (c) we get:

$$DV_{BE} = n(kT_o/q)(1+(T-T_o)/T_o) \ln A = DV_{BEo}(1+aDT)n \qquad (d)$$

Equation (d) highlights the law of variation of the voltage $DV_{BE}$ as a function of temperature, or rather that of its variation DT with respect to the reference temperature To, $DV_{BEo}$ being the value of the voltage $DV_{BE}$ calculated at the reference temperature and a the heat coefficient given by the expression:

$$a = 1/T_o(1/°K.) \qquad (e)$$

The circuit 5 lastly comprises a mesh formed by a first and a second pair of transistors T16, T17, T20, T21, all of the type pnp. The emitters of the transistors T16, T17 are connected together and to a circuit node N4 where the current I is supplied. The collector of the transistor T16 is connected to ground through a resistance R8. The collector of the transistor T17 is connected to ground through an output resistance R7 across which an output voltage Vout is taken. The base of the transistor T16 is connected to ground through a diode D1. The bases of the transistors T16, T17 are connected to the bases of the transistors of the second pair T21, T20, respectively. The emitters of the transistors T20, T21 are connected together at a circuit node N5 where the current I1 is supplied. The collectors of the transistors T20, T21 are connected to the respective bases. The base of the transistor T17 is connected to the collector of a transistor T18 of the type npn arranged in a current mirror configuration with a transistor T19 of the type npn. The emitter of the transistor T18 is grounded, the base is connected to the base of the transistor T19. The emitter of the transistor T19 is grounded, the collector is connected to the base of the same and to the circuit node N3 of the circuit 2, so as to receive the current I2.

With reference to the mesh formed by the transistors T20, T21, T16, T17, on the basis of Kirchhoff's law it is possible to write:

$$V_{EB16} - V_{EB17} = V_{EB21} - V_{EB20} \qquad (1)$$

Since $$V_{EB} = nV_T \ln I_C/I_S = n(kT/q) \ln I_C/I_S \qquad (2)$$

(where n = technological parameter independent of temperature, $I_C$ = collector current, $I_S$ = inverted current of the base-emitter junction), substituting in equation (1), in the hypothesis that all the transistors T20, T21, T16, T17 have the same area, we get:

$$I_{C16}/I_{C17} = I_{C21}/I_{C20} \qquad (3)$$

If we now apply Kirchhoff's law of currents to the intermediate node N4 between the emitters of the transistors T16, T17, in the hypothesis that the base currents of the transistors T16, T17 are negligible, we get:

$$I_{C16} + I_{C17} = I \qquad (4)$$

Similarly, if we apply Kirchoff's law to the node N5 between the emitters of the transistors T20, T21, and assume that the base currents of the transistors T20, T21 are negligible, we get:

$$I_{C21} + I_{C20} = I1 \quad (5)$$

Substituting the values of $I_{C16}$ and of $I_{C21}$ obtained by equations (4) and (5), in equation (3) we get:

$$I/I_{C17} = I1/I_{C20} \quad (6)$$

Ignoring the base current of the transistor T17 we have $I_{C20} = I2$ and we therefore get:

$$I_{C17} = (I2/I1)I \quad (7)$$

The value of the output voltage Vout taken across the resistance R7 is:

$$V_{out} = R7 I_{C17} = R7(I2/I1)I \quad (8)$$

As pointed out earlier, I has been generated as a linear function of the supply voltage according to the expression $I = (k_1 Vcc/R1)$, I1 has been generated by a voltage $V_{BG}$ independent of temperature and has the expression $I1 = V_{BG}/R5$, I2 has been generated according to the expression:

$$I2 = (DV_{BE}/R4 - V_{BG}/R5) = V/R4 \quad (9)$$

where it has been hypothesized that $R4 = k_2 R5$, with $V = DV_{BE} - k_2 V_{BG}$) containing the law of variation with temperature.

The following is thus obtained:

$$V_{out} = (R7/R4)(R5/R1)(k_1 Vcc/V_{BG})V \quad (10)$$

Thus Vout depends on the supply voltage Vcc and has a law of variation with temperature defined by the voltage V.

The bandgap voltage does not determine any law of variation, since it is constant and independent of the value of both the supply voltage and the temperature.

The same is true for the resistances R7, R4, R5, R1, be they constant or be they assumed to be variable with heat coefficients $a_7$, $a_4$, $a_5$, $a_1$, as long as $a_7 = a_4$ and $a_5 = a_1$.

In fact $$(R7/R4)(R5/R1) = ((R7o(1+a_7DT)/(R4o(1+a_4DT)) \times ((R5o(1+a_5DT)/(R1o(1+a_1DT))$$

where R7o, R4o, R5o, R1o are values of the resistances R4, R4, R5, R1 at the reference temperature To.

In the above-mentioned hypothesis then $$(R5/R4)(R5/R1) = (R7o/R4o)(R5o/R1o)$$

which is obviously a coefficient that is independent of temperature.

In an altogether similar manner, with reference to the expression $I = (k_1 Vcc)/R1$, where $k_1 = R2/R3 + R2$), it is possible to hypothesize that the resistances R2, R3, instead of being constant, they are variable with heat coefficients $a_2$, $a_3$, as long as $a_2 = a_3$.

In fact $$R2/(R2+R3) = ((R20(1+a_2DT))/((R20(1+a_2DT))+R30(1=a_3DT))$$

where R2o, R3o are values of the resistances R2, R3 at the reference temperature.

It thus appears that in the above-mentioned hypothesis $$R2/(R2+R3) = ((R20(1=a_2DT))/(a_2DT)(R2o\ R3o)) = R2o/(R2o+R30)$$

that is, independent of temperature.

In summary, the circuit of the present invention allows the generation of a reference voltage that tracks the voltage drop across a resistor as the resistance varies with temperature, and also varies the output voltage as a linear function of the supply voltage.

It is to be understood that even though various embodiments and advantages of the present invention have been set forth in the foregoing description, the above disclosure is illustrative only, and changes may be made in detail and yet remain within the broad principles of the present invention. Therefore, the present invention is to be limited only by the appended claims.

We claim:

1. Generator of a reference voltage, characterized in that it comprises a first generator of current suitable for generating a first current that varies linearly with a supply voltage, a first generator of voltage suitable for generating a constant first voltage with zero thermal drift, a second generator of current suitable for generating a second current dependent on said voltage with zero thermal drift, a second generator of voltage suitable for generating a second voltage with given thermal drift, a third generator of current suitable for generating a third current dependent on said voltage with given thermal drift, and means for combining said currents together so as to produce across an output resistance an output voltage linearly dependent on temperature and having a value equal to the product of said output resistance and the quantity of said first current multiplied by said third current, divided by said second current.

2. Generator of a reference voltage, characterized in that it comprises a first generator of current suitable for generating a first current that varies linearly with a supply voltage, a first generator of voltage suitable for generating a constant first voltage with zero thermal drift, a second generator of current suitable for generating a second current dependent on said voltage with zero thermal drift, a second generator of voltage suitable for generating a second voltage with given thermal drift, a third generator of current suitable for generating a third current dependent on said voltage with given thermal drift, and means for combining said currents together so as to produce across an output resistance an output voltage linearly dependent one temperature having a value equal to the product of said output resistance and the quantity of said first current multiplied by said third current, divided by said second current wherein said generators of current comprise resistive means with heat coefficients selected so as to determine, in combination with said output resistance, resistive parameters that are independent of temperature, so that said output voltage varies with temperature only according to said voltage with given thermal drift.

3. Generator according to claim 2, characterized in that said first generator of current comprises an operational amplifier suitable for controlling the delivery of said first current under the control of a voltage proportional to the supply voltage.

4. Generator according to claim 2, characterized in that said third generator of current is included inside said second generator of current and comprises two NPN transistors with bases connected together and with emitters connected together through a resistance and to ground through a further common resistance, said transistors having different emitter areas.

5. Generator according to claim 1, characterized in that said means for combining said currents are constituted by a first pair of transistors supplied with said first current and in turn supplying the output resistance, by a second pair of transistors supplied with said second current and connected to said first pair of transistors so as to control their conductance and by means suitable for controlling the conductance of the transistors of said first and second pairs in relation to said third current.

6. A circuit for generating a reference voltage that is linearly dependent on a supply voltage, and varies with temperature, the circuit comprising:
   a first current generator generating a current that is linearly dependent on the supply voltage;
   a second current generator generating a current whose value is dependent on a first voltage, said first voltage being essentially independent of variations with temperature;
   third current generator generating a current whose value is dependent on a second voltage, said second voltage being temperature dependent and having a temperature drift that varies linearly as a function of temperature; and
   a summing circuit electrically coupled to said first, second, and third current generators to receive the currents from said first, second, and third current generators and produce an output voltage across an output resistance, said output voltage being linearly dependent on temperature and having a value equal to the product of said output resistance and the quantity of the current from said first current generator multiplied by the current from said third current generator, divided by the current from said second current generator.

7. A circuit for generating a reference voltage that is linearly dependent on a supply voltage, and varies with temperature, the circuit comprising:
   a first current generator generating a current that is linearly dependent on the supply voltage;
   a second current generator generating a current whose value is dependent on a first voltage, said first voltage being essentially independent of variations with temperature;
   a third current generator generating a current whose value is dependent on a second voltage , said second voltage being temperature dependent and having a temperature drift that varies linearly as a function of temperature; and
   a summing circuit electrically coupled to said first, second, and third current generators to receive the currents from said first, second, and third current generators and produce an output voltage across an output resistance, said output voltage being linearly dependent on temperature and having a value equal to the product of said output resistance and the quantity of the current from said first current generator multiplied by the current from said third current generator, divided by the current from said second current generator wherein said first current generator comprises a first mirror transistor and a second mirror transistor connected in a current mirror configuration wherein the bases of said mirror transistors are connected together, the emitters of said transistors are connected together and to the supply voltage, the collector of said first mirror transistor is connected to the base of said first mirror transistor, and the collector of said second mirror transistor is electrically coupled to said summing circuit and provides said first current equal in value to a mirror current through said second transistor.

8. The circuit of claim 7 wherein the value of said mirror current is determined by the value of the supply voltage.

9. The circuit of claim 8 further including an operational amplifier and a first and second voltage reference resistors, said voltage reference resistors connected between the supply voltage and ground and forming a first node at an intersection between said voltage reference resistors, said node being connected to the non-inverting input to said operational amplifier, the inverting input of said operational amplifier being connected to circuit ground through a current limiting resistor and to the emitter of a control transistor, the output of said operational amplifier being connected to the base of said control transistor, the collector of said control transistor being electrically coupled to the collector of said first mirror transistor, whereby said operational amplifier causes said control transistor to produce a current that is dependent on said first and second voltage reference resistors, said control resistor, and the supply voltage.

10. The circuit of claim 7 wherein said second voltage is determined by an ratio of the emitter area of a first transistor to the emitter area of a second transistor.

11. The circuit of claim 10 wherein the base of each of said first and second transistors are connected together and to said first voltage, the emitter of said first transistor is connected to the emitter of said second transistor through a first voltage developing resistor, and to circuit ground through a second voltage developing resistor, the collectors of said first and second transistors are each connected to branches of a second current mirror circuit and said second voltage is generated by allowing equal currents to flow through said first and second transistors so that the voltage drop across each of said first and second transistors is dependent on the emitter area of each of said first and second transistors, respectively, whereby said second voltage is temperature dependent and has a temperature drift that varies linearly as a function of temperature.

12. A circuit for generating a reference voltage that is linearly dependent on a supply voltage, and varies with temperature, said circuit comprising:
   means for generating a first current that is linearly dependent on the supply voltage;
   means for a generating a first voltage, said first voltage being essentially independent of variations with temperature;
   means for generating a second current whose value is dependent on said first voltage so that said second current is essentially independent of temperature;
   means for generating a second voltage, said second voltage being temperature dependent and having a temperature drift that varies linearly as a function of temperature;
   means for generating a third current whose value is dependent on said second voltage so that said third current is temperature dependent and varies linearly as a function of temperature; and means for summing said first, second, and third currents across an output resistance to generate an output voltage, said output voltage being linearly dependent on temperature and having a value equal to the product of said output resistance and the quantity of said first current multiplied by said third current, divided by said second current.

13. A circuit for generating a reference voltage that is linearly dependent on a supply voltage, and varies with temperature, said circuit comprising:

means for generating a first current that is linearly dependent on the supply voltage:

means for generating a first voltage, said first voltage being essentially independent of variations with temperature;

means for generating a second current whose value is dependent on said first voltage so that said second current is essentially independent of temperature;

means for generating a second voltage, said second voltage being temperature dependent and having a temperature drift that varies linearly as a function of temperature;

means for generating a third current whose value is dependent on said second voltage so that said third current is temperature dependent and varies linearly as a function of temperature; and means for summing said first, second, and third currents across an output resistance to generate an output voltage, said output voltage being linearly dependent on temperature and having a value equal to the product of said output resistance and the quantity of said first current multiplied by said third current, divided by said second current wherein said means for generating a first current comprises a first mirror transistor and a second mirror transistor connected in a current mirror configuration wherein the bases of said mirror transistors are connected together, the emitters of said transistors are connected together and to the supply voltage, the collector of said first mirror transistor is connected to the base of said first mirror transistor, and the collector of said second mirror transistor is electrically coupled to said means for summing currents to provide said first current equal in value to a mirror current through said second transistor.

14. The circuit of claim 13 wherein said mirror current value is determined by the supply voltage.

15. The circuit of claim 14 further including an operational amplifier and a first and second voltage reference resistors, said voltage reference resistors connected between the supply voltage and ground and forming a first node at the intersection between said voltage reference resistors, said node being connected to the non-inverting input to said operational amplifier, the inverting input of said operational amplifier being connected to circuit ground through a current limiting resistor and to the emitter of a control transistor, the output of said operational amplifier being connected to the base of said control transistor, the collector of said control transistor being electrically coupled to the collector of said first mirror transistor, whereby said operational amplifies causes said control transistor to produce a current that is dependent on said first and second voltage reference resistors, said control resistor, and the supply voltage.

16. The circuit of claim 13 wherein said means for generating a second voltage utilizes a first and second transistors where said second voltage is determined by a ratio of the emitter area of said first transistor to the emitter area of said second transistor.

17. The circuit of claim 16 wherein the base of each of said first and second transistors are connected together and to said means for generating a first voltage, the emitter of said first transistor is connected to the emitter of said second transistor through a first voltage developing resistor, and to circuit ground through a second voltage developing resistor, the collectors of said first and second transistors are each connected to branches of a second current mirror circuit, and said second voltage is generated by allowing equal currents to flow through said first and second transistors so that the voltage drop across each of said first and second transistors is dependent on the emitter area of each of said first and second transistors, respectively, whereby said second voltage is temperature dependent and has a temperature drift that varies linearly as a function of temperature.

* * * * *

UNITED STATES PATENT AND TRADEMARK OFFICE
CERTIFICATE OF CORRECTION

PATENT NO. : 5,266,885
DATED : November 30, 1993
INVENTOR(S) : Massimiliano Brambilla and Vanni Poletto It is certified that error appears in the above-indentified patent and that said Letters Patent is hereby corrected as shown below:

In column 7, claim 5, line 8, please delete "1" and substitute therefor --2--.

In column 8, claim 10, line 34, please delete "an" and substitute therefor --a--.

In column 8, claim 12, line 57, please delete "a generating" and substitute therefor --generating--.

Signed and Sealed this

Sixteenth Day of August, 1994

Attest:

BRUCE LEHMAN

Attesting Officer     Commissioner of Patents and Trademarks